US012648384B2

(12) United States Patent
Kim et al.

(10) Patent No.: US 12,648,384 B2
(45) Date of Patent: Jun. 2, 2026

(54) METHOD AND SUBSTRATE PROCESSING SYSTEM FOR FORMING INTERCONNECT TO POWER RAILS BY METAL ASSISTED CHEMICAL ETCHING PROCESS

(71) Applicant: SEMES CO., LTD., Cheonan-si (KR)

(72) Inventors: Minyoung Kim, Hwaseong-si (KR); Hanglim Lee, Cheonan-si (KR); Yunsang Kim, Seongnam-si (KR)

(73) Assignee: Semes Co., LTD., Cheonan-si (KR)

( * ) Notice: Subject to any disclaimer, the term of this patent is extended or adjusted under 35 U.S.C. 154(b) by 509 days.

(21) Appl. No.: 18/304,754

(22) Filed: Apr. 21, 2023

(65) Prior Publication Data

US 2023/0377894 A1      Nov. 23, 2023

(30) Foreign Application Priority Data

May 19, 2022    (KR) ........................ 10-2022-0061550

(51) Int. Cl.
H10P 50/64 (2026.01)
H10P 72/00 (2026.01)
(Continued)

(52) U.S. Cl.
CPC ........ H10P 50/644 (2026.01); H10P 72/0424 (2026.01); H10P 72/0426 (2026.01); H10W 20/023 (2026.01); H10W 20/20 (2026.01)

(58) Field of Classification Search
CPC ........... H01L 21/30608; H01L 21/6708; H01L 21/67086; H01L 21/76898; H01L 23/481; H01L 23/535; H01L 23/5286; H01L 21/67011; H01L 21/67063; H01L 21/67075; H01L 21/76879; H01L 21/30604; H01L 21/3086; H01L 21/67207;

(Continued)

(56) References Cited

U.S. PATENT DOCUMENTS 7,382,037 B2      6/2008   Umemoto et al.
9,437,441 B2      9/2016   Oh et al.
(Continued)

FOREIGN PATENT DOCUMENTS

EP          3742487 A1     11/2020
JP       2021504961 A      2/2021
(Continued)

OTHER PUBLICATIONS

Korean Office Action for Korean Patent Application No. KR 10-2022-0061550 dated Apr. 19, 2023.

*Primary Examiner* — Herve-Louis Y Assouman
(74) *Attorney, Agent, or Firm* — Harness, Dickey & Pierce, P.L.C.

(57)          ABSTRACT

Disclosed is a method of forming a semiconductor device, the method including: forming at least one metal catalyst layer on a rear surface of a semiconductor substrate, on which at least one buried power rail for power transfer is formed, to be at least partially aligned with the buried power rail; and forming at least one rear surface via hole by supplying an etchant to the semiconductor substrate so that the semiconductor substrate between the metal catalyst layer and the buried power rail is anisotropically etched while the metal catalyst layer descends to an inside of the semiconductor substrate using metal-assisted chemical etching (MACE).

16 Claims, 9 Drawing Sheets

(51) Int. Cl.
    *H10W 20/00*        (2026.01)
    *H10W 20/20*        (2026.01)

(58) Field of Classification Search
    CPC ............. H01L 21/743; H01L 21/76852; H01L
                                     21/76877
    See application file for complete search history.

(56)                      References Cited

U.S. PATENT DOCUMENTS

| | | |
|---|---|---|
| 10,872,818 B2 | 12/2020 | Chiang et al. |
| 11,233,008 B2 | 1/2022 | Hong et al. |
| 11,257,764 B2 | 2/2022 | Hiblot et al. |
| 11,355,601 B2 | 6/2022 | Chiang et al. |
| 2016/0126133 A1* | 5/2016 | Li .................... H01L 21/76898 |
| | | 438/667 |
| 2020/0365464 A1* | 11/2020 | Sreenivasan ...... H01L 21/30604 |
| 2020/0373331 A1* | 11/2020 | Kim .................... H10D 86/201 |
| 2021/0036170 A1 | 2/2021 | Oh et al. |
| 2022/0020666 A1* | 1/2022 | Van Dal ............. H10D 30/6211 |
| 2022/0139717 A1 | 5/2022 | Sreenivasan et al. |

FOREIGN PATENT DOCUMENTS

| | | | |
|---|---|---|---|
| KR | 20060051564 A | 5/2006 | |
| KR | 20090052331 A | 5/2009 | |
| KR | 101620981 B1 | 5/2016 | |
| KR | 20160125588 A | 11/2016 | |
| KR | 20200049468 A | 5/2020 | |
| KR | 20200077646 A | 7/2020 | |
| KR | 20200145651 A | 12/2020 | |
| KR | 20210015709 A | 2/2021 | |
| KR | 20210122659 A | 10/2021 | |
| KR | 20210142118 A | 11/2021 | |
| WO | WO 2019108366 A1 * | 6/2019 | ........... H01L 21/768 |

* cited by examiner

FORM AT LEAST ONE METAL CATALYST LAYER ON REAR SURFACE OF SEMICONDUCTOR SUBSTRATE —S10

ETCH SEMICONDUCTOR SUBSTRATE USING METAL-ASSISTED CHEMICAL ETCHING (MACE) TO FORM AT LEAST ONE REAR SURFACE VIA HOLE —S20

FORM BURIED CONDUCTIVE LAYER IN AT LEAST ONE REAR SURFACE VIA HOLE —S30

METHOD AND SUBSTRATE PROCESSING SYSTEM FOR FORMING INTERCONNECT TO POWER RAILS BY METAL ASSISTED CHEMICAL ETCHING PROCESS

CROSS-REFERENCE TO RELATED APPLICATION

This application claims priority to and the benefit of Korean Patent Application No. 10-2022-0061550, filed on May 19, 2022, the disclosure of which is incorporated herein by reference in its entirety.

BACKGROUND OF THE DISCLOSURE

1. Field of the Disclosure

The present disclosure relates to semiconductor fabrication, and more particularly, to a method of forming a semiconductor device and a substrate processing system therefor.

2. Description of the Related Art

Wiring structures as well as semiconductor devices are becoming more complex with increasing integration of semiconductor devices. As a result, the resistance of wiring for power transmission of a semiconductor device increases so that the proportion of voltage drop in the wiring increases during a power transmission process. Accordingly, a low-resistance power grid design is required in highly integrated semiconductor devices.

For example, a structure in which a buried power rail is installed on a semiconductor substrate and a through-via electrode for power transmission is connected to the buried power rail is being developed. Conventionally, such a through-via electrode, e.g., a Through Substrate Via (TSV), is formed using laser drilling or plasma etching.

However, these methods cause an increase in process costs. Furthermore, in the case of plasma etching, the inside of the substrate may suffer ion damage by plasma. Therefore, there is a need for a method capable of reducing damage to a substrate while lowering process costs.

SUMMARY OF THE DISCLOSURE

Therefore, the present disclosure has been made in view of the above problems, and it is an object of the present disclosure to provide a method of forming a semiconductor device which is capable of reducing damage to a substrate while lowering process costs, and a substrate processing system for forming a semiconductor device. It will be understood that the technical problems are only provided as examples, and the scope of the present disclosure is not limited thereto.

In accordance with an aspect of the present disclosure, the above and other objects can be accomplished by the provision of a method of forming a semiconductor device, the method including: forming at least one metal catalyst layer on a rear surface of a semiconductor substrate, on which at least one buried power rail for power transfer is formed, to be at least partially aligned with the buried power rail; and forming at least one rear surface via hole by supplying an etchant to the semiconductor substrate so that the semiconductor substrate between the metal catalyst layer and the buried power rail is anisotropically etched while the metal catalyst layer descends to an inside of the semiconductor substrate using metal-assisted chemical etching (MACE).

According to the method of forming a semiconductor device, in the forming of the rear surface via hole, etching of the semiconductor substrate may be performed to be at least partially stopped on the buried power rail.

According to the method of forming a semiconductor device, at least a top and side walls of the buried power rail may be surrounded by an insulating liner layer when viewed on a rear surface of the semiconductor substrate, and in the forming of the rear surface via hole, etching of the semiconductor substrate may be performed to be stopped while the metal catalyst layer at least partially contacts the insulating liner layer.

According to the method of forming a semiconductor device, a diameter or width of the metal catalyst layer may be smaller than or equal to a diameter or width of the buried power rail, and when viewed from a cross-section of the semiconductor substrate, the metal catalyst layer may be vertically aligned with the buried power rail to be spaced apart from each other or may be vertically spaced from each other within the width of the buried power rail.

According to the method of forming a semiconductor device, the buried power rail may include a plurality of buried power rails formed on the semiconductor substrate, and the metal catalyst layer may include a plurality of metal catalyst layers formed on a rear surface of the semiconductor substrate to be at least partially aligned with the plural buried power rails, respectively.

According to the method of forming a semiconductor device, the method may further include forming a passivation insulating layer having openings aligned at least partially with the plural buried power rails on a rear surface of the semiconductor substrate, and the forming of the metal catalyst layer may include respectively forming the plural metal catalyst layers in the openings of the passivation insulating layer.

According to the method of forming a semiconductor device, the forming of the passivation insulating layer may include: exposing the openings on the passivation insulating layer to form a photoresist layer; and etching the passivation insulating layer using the photoresist layer as an etch protection layer to form the openings, the forming of the metal catalyst layer includes: forming a metal catalyst layer on the passivation insulating layer in which the photoresist layer remains; and removing a portion of the photoresist layer of the metal catalyst layer using a lift-off method to form the plural metal catalyst layers to remain in the openings.

According to the method of forming a semiconductor device, the method may further include removing the metal catalyst layer lowered to a bottom surface of the rear surface via hole; forming a liner dielectric layer on at least a sidewall of the rear surface via hole; and forming a buried conductive layer such that the rear surface via hole is filled.

According to the method of forming a semiconductor device, the method may further include removing at least a portion of an insulating liner layer on the buried power rail exposed by the rear surface via hole such that the buried power rail is exposed, after the removing of the metal catalyst layer.

According to the method of forming a semiconductor device, the forming of the liner dielectric layer may include: forming the liner dielectric layer on an inner surface of the rear surface via hole; and partially removing the liner dielectric layer on a bottom surface of the rear surface via hole such that the liner dielectric layer remains on side walls of the rear surface via hole.

According to the method of forming a semiconductor device, in the partially removing of the liner dielectric layer, anisotropic plasma etching may be used.

According to the method of forming a semiconductor device, the method may further include forming a diffusion prevention layer to be connected to the buried power rail on an inner surface of the rear surface via hole from which the liner dielectric layer is partially removed, and the buried conductive layer may be formed in the rear surface via hole to be connected to the diffusion prevention layer.

According to the method of forming a semiconductor device, the buried power rail, the metal catalyst layer and the buried conductive layer may include an identical metal.

According to the method of forming a semiconductor device, the buried power rail, the metal catalyst layer and the buried conductive layer may include ruthenium (Ru).

According to the method of forming a semiconductor device, in the forming of the rear surface via hole, the etchant may include a mixture of $H_2O_2$ and HF.

In accordance with another aspect of the present disclosure, there is provided a method of forming a semiconductor device, the method including: forming at least one metal catalyst layer on a rear surface of a semiconductor substrate, on which at least one buried power rail for power transfer is formed, to be at least partially aligned with the buried power rail; forming at least one rear surface via hole by supplying an etchant to the semiconductor substrate so that the semiconductor substrate under the metal catalyst layer is anisotropically etched while the metal catalyst layer descends to an inside of the semiconductor substrate using metal-assisted chemical etching (MACE), wherein etching of the semiconductor substrate between the metal catalyst layer and the buried power rail is performed to be stopped as an insulating liner layer on the buried power rail is at least partially exposed; removing the metal catalyst layer lowered to a bottom surface of the rear surface via hole; removing at least a portion of the insulating liner layer on the buried power rail exposed by the rear surface via hole; forming a liner dielectric layer on at least a side wall of the rear surface via hole; forming a diffusion prevention layer on an inner surface of the rear surface via hole, from which the liner dielectric layer is partially removed, to be connected to the buried power rail; and forming a buried conductive layer to fill the rear surface via hole.

In accordance with yet another aspect of the present disclosure, there is provided a substrate processing system for forming a semiconductor device, including: a substrate in-out module for carrying in or out of a semiconductor substrate on which at least one buried power rail for power transfer is formed; a metal deposition module for forming at least one metal catalyst layer on a rear surface of the semiconductor substrate to be at least partially aligned with the buried power rail; and a metal-promoted chemical etch module for forming at least one rear surface via hole by supplying an etchant to the semiconductor substrate so that the semiconductor substrate between the metal catalyst layer and the buried power rail is anisotropically etched while the metal catalyst layer descends to an inside of the semiconductor substrate using metal-assisted chemical etching (MACE).

According to the substrate processing system, the substrate may further include a dielectric layer deposition module for forming a liner dielectric layer on at least a side wall of the rear surface via hole.

According to the substrate processing system, the substrate may further include a wet etching module for removing the metal catalyst layer lowered to a bottom surface of the rear surface via hole.

According to the substrate processing system, the metal deposition module may be used to form a buried conductive layer for filling the rear surface via hole.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
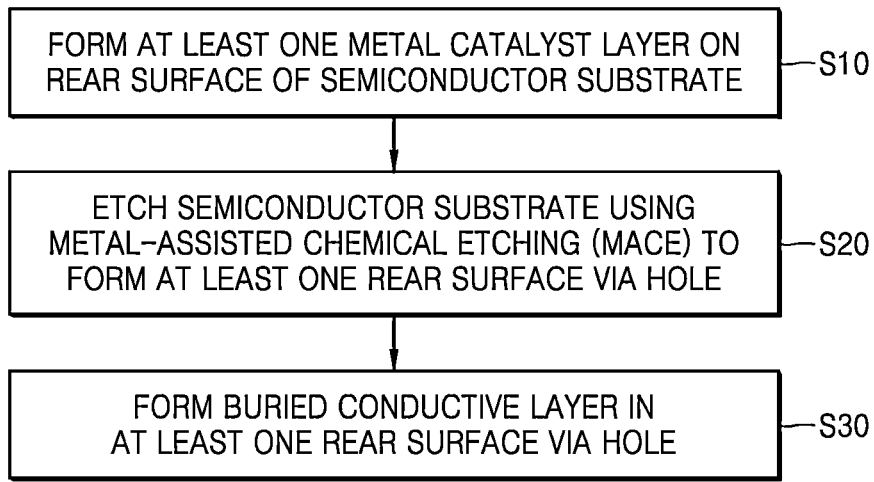
FIG. 1 is a schematic flowchart illustrating a method of forming a semiconductor device according to an embodiment of the present disclosure.

Hereinafter, one or more preferred embodiments of the present disclosure will be described in detail with reference to the accompanying drawings.

Embodiments of the present disclosure are provided to more completely explain the present disclosure to those skilled in the art, and the following embodiments may be modified in many different forms, but the scope of the present disclosure is not limited to the following embodiments. Rather, the embodiments are provided to make the disclosure thorough and complete and to fully convey the technical idea of the disclosure to those skilled in the art. In the drawings, the thicknesses and sizes of layers may be exaggerated for convenience and clarity of explanation.

Embodiments of the disclosure are described herein with reference to drawings that schematically illustrate idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

FIG. 1 is a schematic flowchart illustrating a method of forming a semiconductor device according to an embodiment of the present disclosure, and FIGS. 2 to 13 are sectional views illustrating a method of forming a semiconductor device according to an embodiment of the present disclosure.

Referring to FIGS. 1 to 5, at least one metal catalyst layer 140 may be formed on a rear surface 108 of a semiconductor substrate 105 (S10). For example, the metal catalyst layer 140 may be formed on the rear surface 108 of the semiconductor substrate 105 to be at least partially aligned with at least one buried power rail 120.

The semiconductor substrate 105 may refer to a substrate including a semiconductor material, e.g., silicon (Si), germanium (Ge), silicon-germanium (Si—Ge) or the like. In the semiconductor substrate 105, the semiconductor material may have a single crystal structure, and, furthermore, may further epitaxial layers by adding a bulk single crystal structure. The semiconductor substrate 105 may have various shapes, e.g., a wafer shape Furthermore, a display structure such as a flat zone or a notch may be formed on the semiconductor substrate 105 to display a reference plane. In some embodiments, the semiconductor substrate 105 may be understood to further include a laminate structure formed on the semiconductor material in addition to the semiconductor material. Referring to FIGS. 2 to 5, it can be understood that the semiconductor substrate 105 is disposed upside down such that a front surface 106 thereof faces down and a rear surface 108 thereof faces up.

Figure 2:
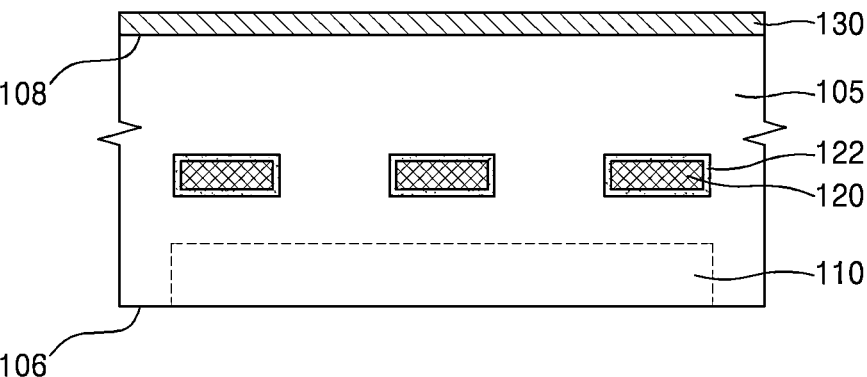
FIGS. 2 to 13 are sectional views illustrating a method of forming a semiconductor device according to an embodiment of the present disclosure.

As shown in FIG. 2, a device structure 110 may be formed in the semiconductor substrate 105. The device structure 110 may be formed using the semiconductor substrate 105. For example, the device structure 110 may be formed in the front surface 106 of the semiconductor substrate 105, or some structures may be formed in the semiconductor substrate 105 and other structures may be laminated and formed on the front surface 106 of the semiconductor substrate 105.

In some embodiments, the device structure 110 may include one or more integrated structures of active devices, e.g., a field effect transistor (FET), a diode and a bipolar junction transistor (BJT). For example, the field effect transistor (FET) may have various structures such as MOSFET with a planar gate structure, MOSFET with a recess gate structure, MOSFET with a gate all around (AA) structure, and MOSFET with a fin structure. Furthermore, the device structure 110 may further include one or more integrated structures of passive devices, e.g., a resistor, an inductor and a capacitor, in addition to the active device.

Furthermore, multilayer wiring structures for connecting the devices may be further formed on the device structure 110.

At least one buried power rail 120 may be formed in the semiconductor substrate 105. The buried power rail 120 may be used for power transfer to the device structure 110. For example, the buried power rail 120 may be connected to at least one power terminal for driving the device structure 110.

The device structure 110 may include a plurality of active devices, and each of the active devices may include at least one pair of power supply terminals. For example, in MOSFET, a driving voltage (Vdd) may be applied to a drain electrode, a reference voltage (Vss) may be applied to a source electrode, and a word line voltage may be applied to a gate electrode. For power transfer to the active devices, the plural buried power rails 120 may be formed in the semiconductor substrate 105. The number of the buried power rails 120 may be appropriately selected according to the number of the power transfer terminals of the device structure 110.

In some embodiments, at least a portion of the buried power rails 120 may be surrounded by an insulating liner layer 122. For example, when viewed on the rear surface 108 of the semiconductor substrate 105, at least the top and side walls of the buried power rails 120 may be surrounded by the insulating liner layer 122. More particularly, when the buried power rails 120 are formed in the semiconductor substrate 105, the buried power rails 120 may be disposed to be entirely surrounded by the insulating liner layer 122 for insulation between the semiconductor substrate 105 and the buried power rails 120. For example, the insulating liner layer 122 may include an appropriate insulating material, e.g., an oxide, a nitride and/or an oxynitride.

A buried conductive material may be included in the insulating liner layer 122 of the buried power rails 120. For example, the buried conductive material may include an appropriate conductive material, e.g., tungsten (W), ruthenium (Ru), gold (Au), platinum (Pt), or the like. Furthermore, before forming the buried conductive material, a diffusion prevention layer may be further formed on the insulating liner layer 122 of the buried power rails 120. Meanwhile, since the diffusion prevention layer is also formed of a conductive material, it may be understood that the buried conductive material includes a diffusion prevention layer.

In some embodiments, the buried power rails 120 may be formed in an insulating layer in the semiconductor substrate 105 or on the semiconductor substrate 105. In this case, at least a portion of the insulating layer may be understood as the insulating liner layer 122.

In some embodiments, after forming the device structure 110, the thickness of the rear surface 108 of the semiconductor substrate 105 may be thinned. For example, the rear surface of the semiconductor substrate 105 may be thinned through a back grinding process, etc. Accordingly, a depth from the rear surface 108 of the semiconductor substrate 105 to the buried power rails 120 may be reduced to about 1000 10 nm or less, e.g., 100 to 500 nm.

Hereinafter, an embodiment of a step (S10) of forming a metal catalyst layer 140 is described in more detail.

Figure 3:
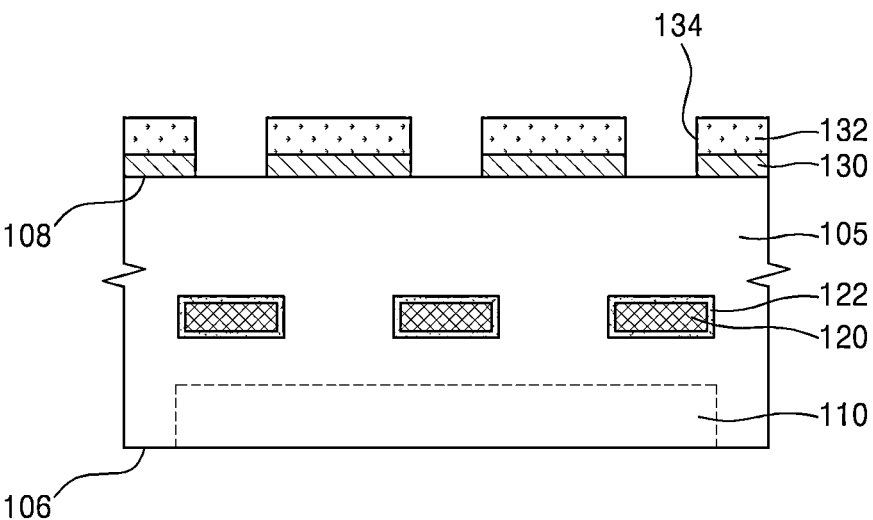

Referring to FIGS. 2 and 3, a passivation insulating layer 130 may be formed on the rear surface 108 of the semiconductor substrate 105 and may have openings 134 aligned at least partially with the buried power rails 120.

More particularly, the passivation insulating layer 130 may be formed on the rear surface 108 of the semiconductor substrate 105, as shown in FIG. 2. For example, the passivation insulating layer 130 may include an appropriate insulating material, e.g., an oxide, a nitride and/or an oxynitride.

As shown in FIG. 3, a photoresist layer 132 may be formed on the passivation insulating layer 130 to expose the openings 134. For example, after entirely forming the photoresist layer 132 on the passivation insulating layer 130, the top of the openings 134 may be exposed by patterning the photoresist layer 132 using an exposure and develop process.

Next, the openings 134 may be formed by etching the passivation insulating layer 130 using the photoresist layer 132 as an etch protection layer. For example, the passivation insulating layer 130 may be etched using dry etching, e.g., plasma etching.

Figure 4:
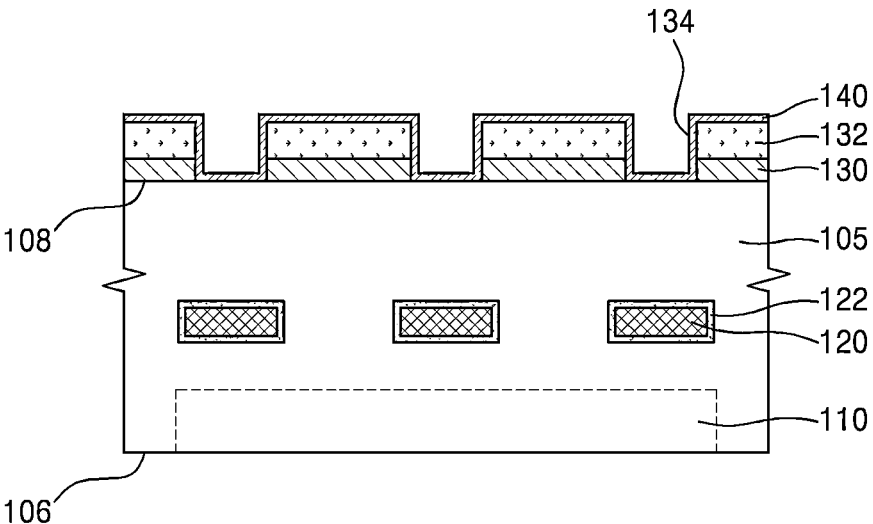

Referring to FIG. 4, the metal catalyst layer 140 may be formed on the passivation insulating layer 130 on which the photoresist layer 132 remains. The metal catalyst layer 140 may include a metal catalyst for metal-assisted chemical etching (MACE) as described below. In some embodiments, the MACE may be referred to as catalyst-assisted chemical etching in that it uses a catalytic metal.

For example, the metal catalyst layer 140 may include various metals serving as a catalyst. For example, the metal catalyst layer 140 may include ruthenium (Ru), tungsten (W), platinum (Pt), gold (Au), or the like as a catalytic metal. In some embodiments, a catalytic metal such as gold (Au) or copper (Cu) is excluded because they may make deep levels of impurities remain in the semiconductor substrate 105, and ruthenium (Ru) or tungsten (W) may be selected. Furthermore, a catalytic metal such as ruthenium (Ru) has an advantage of lower resistivity than tungsten (W). The metal catalyst layer 140 may be formed using an appropriate deposition method, e.g., chemical vapor deposition (CVD), atomic layer deposition (ALD), or the like.

Figure 5:
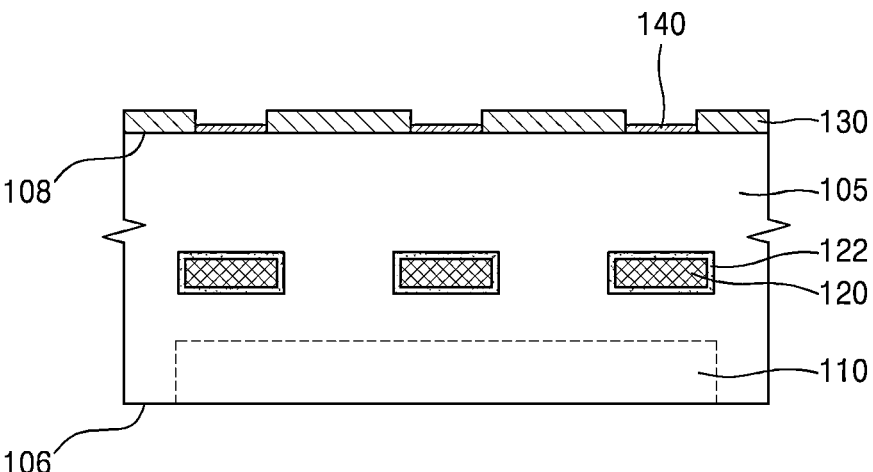

Referring to FIG. 5, a plurality of metal catalyst layers 140 to remain in the openings 134 may be formed by removing a portion of the photoresist layer 132 of the metal catalyst layer 140 using a lift-off method. Accordingly, the metal catalyst layers 140 may be respectively formed in the openings 134 of the passivation insulating layer 130.

The metal catalyst layers 140 may be formed on the rear surface 108 of the semiconductor substrate 105 to be at least partially aligned with the buried power rails 120. The number of the metal catalyst layers 140 may be one or more depending upon the number of rear surface via holes 145 for connection with the buried power rails 120 to be described below.

In some embodiments, the diameter or width of the metal catalyst layers 140 may be smaller than or the same as that of the buried power rails 120. Furthermore, when viewed from the cross-section of the semiconductor substrate 105, the metal catalyst layers 140 are vertically aligned with the buried power rails 120 to be spaced apart from each other or may be vertically spaced from each other within the width of the buried power rails 120. According to such a structure, when projected onto the rear surface 108 of the semiconductor substrate 105, each of the metal catalyst layers 140 may be disposed to overlap a portion of each of the buried power rails 120 or to be included in each of the buried power rails 120.

As described above, the metal catalyst layers 140 may be formed at a relatively low using a lift-off method.

However, since it is not easy to make a precise fine pattern using a lift-off method, the metal catalyst layers 140 may be formed using a photolithography method, instead of the lift-off method, according to another embodiment of the present disclosure when a precise fine pattern is required.

Figure 14:
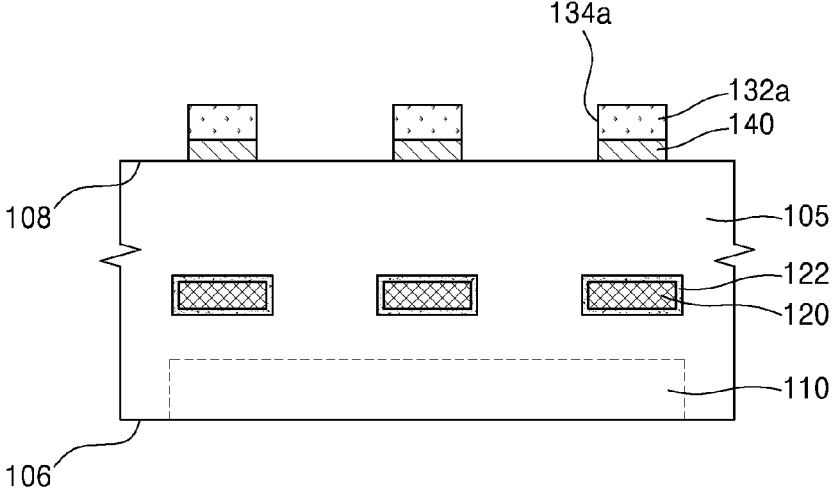
FIG. 14 is a sectional view illustrating a part of a method of forming a semiconductor device according to another embodiment of the present disclosure.

FIG. 14 is a sectional view illustrating a part of a method of forming a semiconductor device according to another embodiment of the present disclosure.

Referring to FIG. 14, the metal catalyst layer 140 is formed on the rear surface 108 of the semiconductor substrate 105, and then a photoresist layer 132a having openings 134a may be formed thereon. The photoresist layer 132a may be formed in a pattern shape using a coating process, an exposure process, and a development process. Next, the metal catalyst layers 140 may be formed to be aligned at least partially with the buried power rails 120 by etching the metal catalyst layer 140 using the photoresist layer 132a as an etch protection film. In this case, the passivation insulating layer 130 may be omitted.

Referring to FIGS. 1 and 6 again, at least one rear surface via hole 145 may be formed by etching the semiconductor substrate 105 using MACE (S20). For example, in S20, the via hole 145 may be formed by supplying an etchant to the semiconductor substrate 105 so that the semiconductor substrate 105 between the metal catalyst layer 140 and the buried power rail 120 is anisotropically etched while the metal catalyst layer 140 descends to the inside of the semiconductor substrate 105 using MACE.

Figure 6:
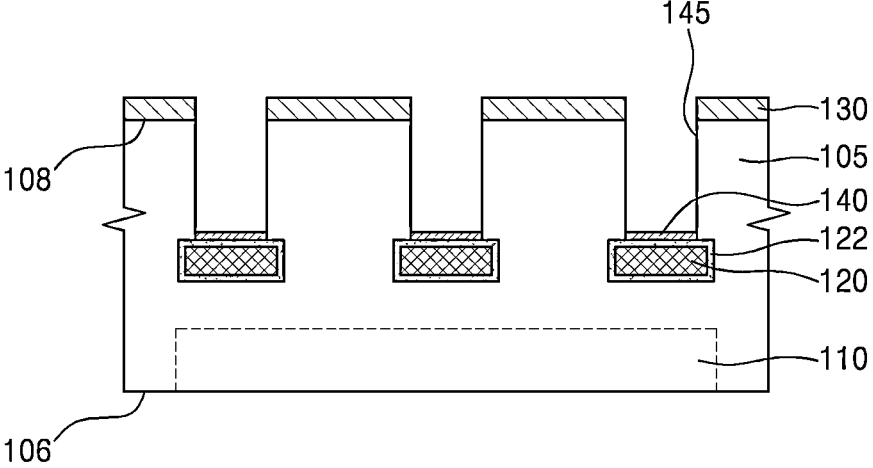

More particularly, as shown in FIG. 6, MACE may be induced by supplying an etchant to the semiconductor substrate 105. For example, the etchant may include a mixture of an oxidizing agent and an oxide-removing agent for etching the semiconductor substrate 105. The oxidizing agent may include $HNO_3$, $H_2O_2$, or the like, and the oxide-removing agent may include a fluorine (F) or chlorine (Cl) compound, e.g., HF, etc. For example, the etchant may be provided onto the semiconductor substrate 105 in the form of droplets, or the semiconductor substrate 105 may be immersed in the etchant so that the etchant is supplied to the semiconductor substrate 105.

Conventional wet etching methods induce isotropic etching. However, MACE can be understood as a kind of wet etching using an etching solution, but can induce anisotropic etching. That is, when the metal catalyst layers 140 is absent, etching of the semiconductor substrate 105 by an etchant may proceed very slowly. However, according to MACE, the metal catalyst layers 140 descend while rapid etching of the semiconductor substrate 105 occurs under the metal catalyst layers 140, allowing anisotropic etching to be performed.

For example, when the metal catalyst layers 140 are on the semiconductor substrate 105, the oxidizing agent may be reduced by receiving electrons from the metal catalyst layers 140. Furthermore, directly below the metal catalyst layers 140, electron transfer occurs between the semiconductor material and the metal catalyst, and the oxidizing agent is supplied to oxidize the semiconductor material so that the semiconductor material can be etched. As a result, MACE may be similar to a kind of micro galvanic cell reaction in which reduction and oxidation reactions are paired simultaneously.

Accordingly, by MACE, local etching of the semiconductor substrate 105 under the metal catalyst layers 140 occurs, and material transfer may occur at an interface between the metal catalyst layers 140 and the semiconductor substrate 105. Accordingly, as the semiconductor substrate 105 under the metal catalyst layers 140 is etched, the metal catalyst layers 140 penetrate the semiconductor substrate 105 so that anisotropic etching can be induced. Therefore, the plural rear surface via holes 145 may be formed using MACE without causing plasma damage.

In some embodiments, in S20 of forming at least one rear surface via hole 145, etching of the semiconductor substrate 105 by MACE may be performed to be at least partially stopped on the buried power rail 120. For example, etching of the plural rear surface via holes 145 may be respectively performed so as to be at least partially stopped on the plural buried power rails 120.

More particularly, in the step of forming the rear surface via holes 145, etching of the semiconductor substrate 105 may be performed to be stationary while at least partially contacting the insulating liner layer 122 of the metal catalyst layers 140. That is, MACE may be automatically stopped when the etching of the semiconductor substrate 105 between the metal catalyst layers 140 and the buried power rails 120 is completed and the metal catalyst layers 140 meets the insulating liner layer 122 on the buried power rails 120.

For example, when the metal catalyst layers 140 are aligned entirely with the buried power rails 120 on the cross-section of the semiconductor substrate 105, the rear surface via holes 145 may be formed on the buried power rails 120 to be aligned with the buried power rails 120.

As another embodiment, when the metal catalyst layers 140 is disposed within the buried power rails 120 on the cross-section of the semiconductor substrate 105, the rear surface via holes 145 may be aligned in the buried power rails 120 in a width range of the buried power rails 120. In this case, etching of the rear surface via holes 145 may be entirely stopped on the insulating liner layer 122 on the buried power rails 120, and a bottom surface of each of the metal catalyst layers 140 lowered to a bottom surface of each of the rear surface via holes 145 may be entirely in contact with the insulating liner layer 122.

In some embodiments, the metal catalyst layers 140 may be only partially aligned with the buried power rails 120. In this case, a portion of the rear surface via hole 145 may extend onto the insulating liner layer 122 on the buried power rails 120, and another portion of the rear surface via hole 145 may extend downward along a side of the buried power rails 120.

Figure 7:
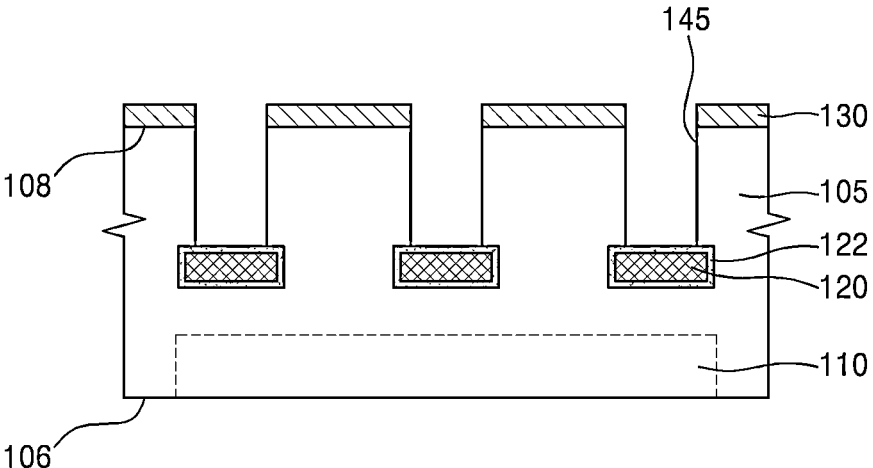

Referring to FIG. 7, the metal catalyst layers 140 extended to a bottom surface of the rear surface via holes 145 may be removed. Accordingly, the insulating liner layer 122 on the buried power rails 120 may be exposed by the rear surface via holes 145. For example, the metal catalyst layers 140 may be removed using wet etching or chemical dry etching so as not to cause plasma damage in the semiconductor substrate 105. As another embodiment, since the metal catalyst layers 140 are not thick, plasma etching may be used.

Figure 8:
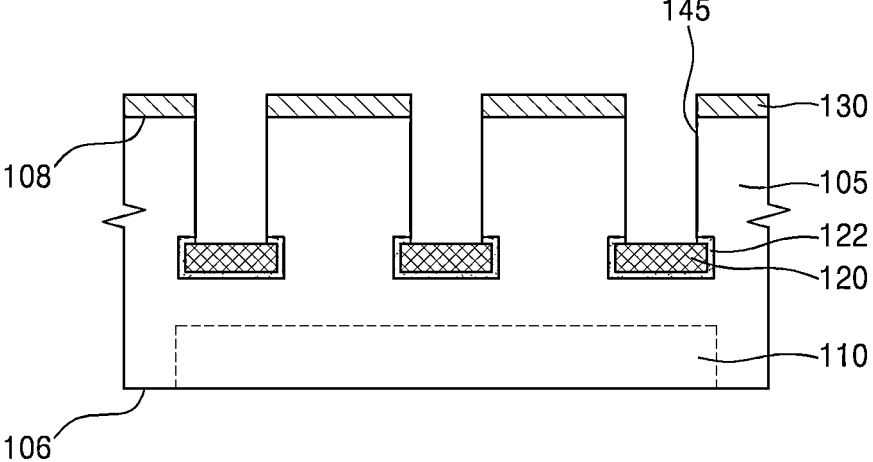

Referring to FIG. 8, after removing the metal catalyst layers 140, at least a portion of the exposed insulating liner layer 122 on the buried power rails 120 may be removed by the rear surface via holes 145. Accordingly, the buried power rails 120 may be exposed by the rear surface via holes 145.

For example, the insulating liner layer 122 may be removed using wet etching or chemical dry etching so as not to cause plasma damage in the semiconductor substrate 105. As another embodiment, since the insulating liner layer 122 is not thick, plasma etching may be used.

Figure 9:
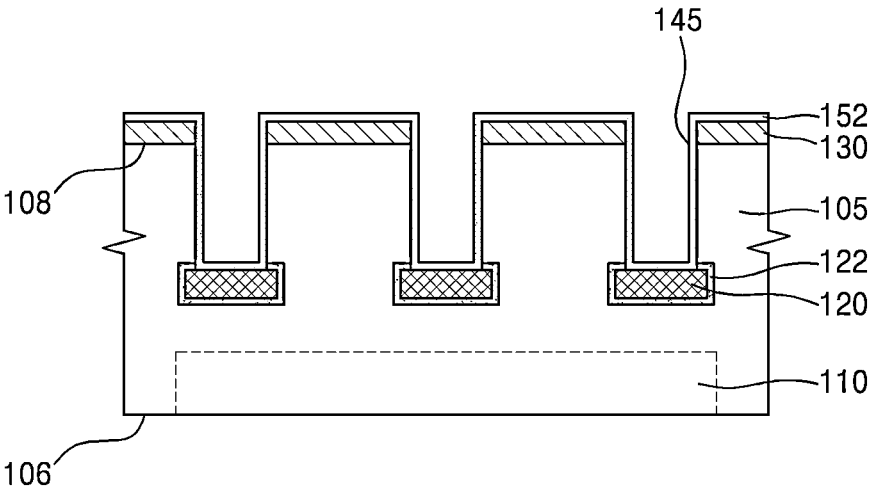
Figure 10:
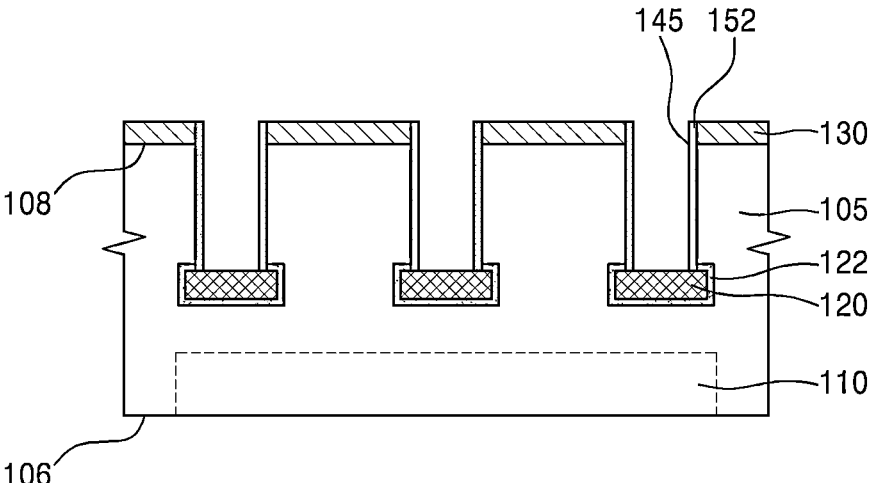

Referring to FIGS. 9 and 10, a liner dielectric layer 152 may be formed on at least sidewalls of the rear surface via holes 145. For example, the liner dielectric layer 152 may include one or multi-layer structure of an oxide, an insulator and an oxynitride.

More particularly, the liner dielectric layer 152 may be formed on at least inner surfaces of the rear surface via holes 145, as shown in FIG. 9. Next, the liner dielectric layer 152 on the bottom surface of the rear surface via holes 145 may be partially removed such that the liner dielectric layer 152 remains on the sidewalls of the rear surface via holes 145, as shown in FIG. 10. For example, anisotropic plasma etching may be used in the step of partially removing the liner dielectric layer 152.

Referring to FIGS. 1 and 11 to 13, a buried conductive layer 156 may be formed in the rear surface via hole 145 (S30).

Figure 11:
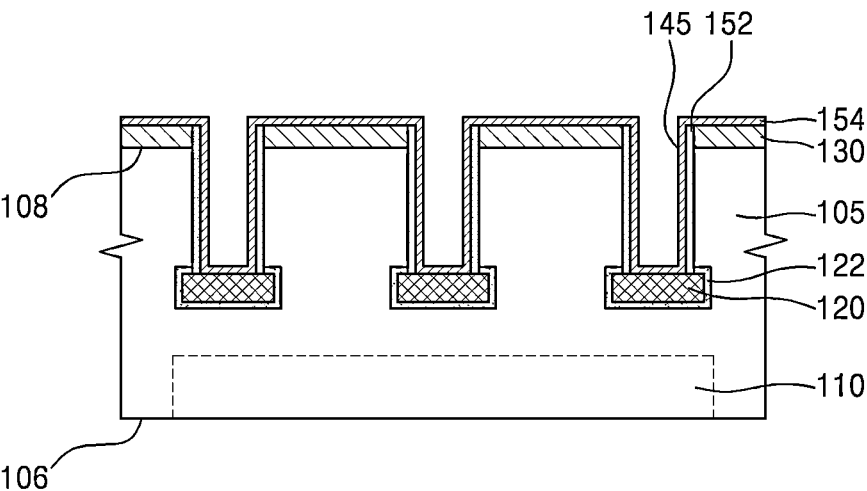

More particularly, a diffusion prevention layer 154 may be formed on an inner surface of the rear surface via holes 145, from which the liner dielectric layer 122 is partially removed, to be connected to the buried power rails 120, as shown in FIG. 11. For example, the diffusion prevention layer 154 may include a metal or metal nitride such as titanium (Ti), tantalum (Ta), titanium nitride (TiN), or tantalum nitride (TaN) or a stacked structure thereof.

Figure 12:
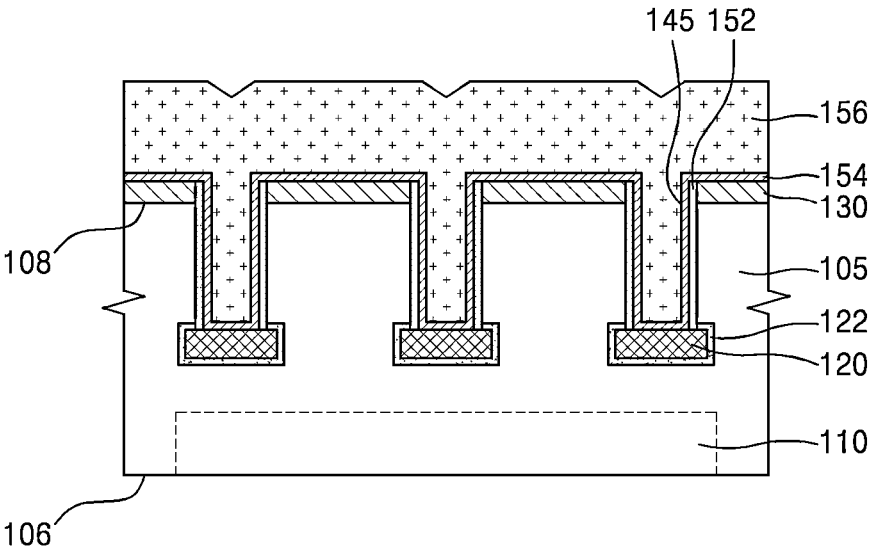

Next, as shown in FIG. 12, the buried conductive layer 156 may be formed to at least fill the rear surface via holes 145. The buried conductive layer 156 may be connected to the diffusion prevention layer 154. For example, the buried conductive layer 156 may include a suitable metal, e.g., ruthenium (Ru), tungsten (W), copper (Cu), or the like.

Figure 13:
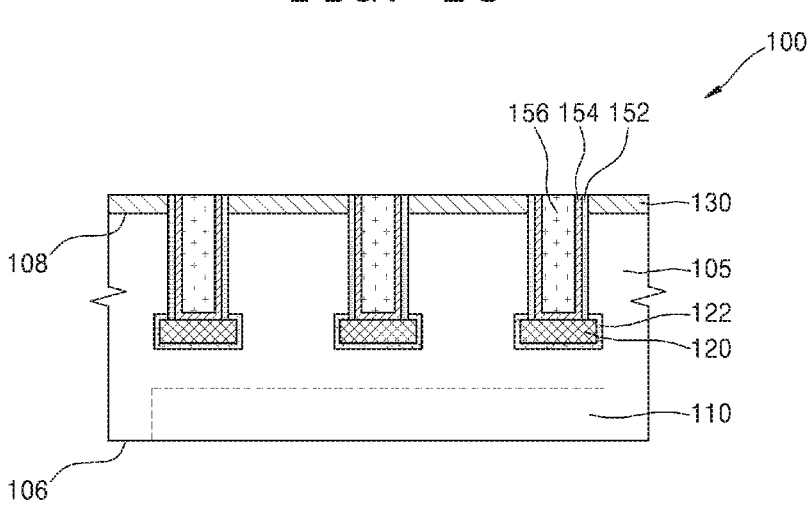

Next, the buried conductive layer 156 may be separated into a plurality of layers while being planarized, as shown in FIG. 13. For example, planarization of the buried conductive layer 156 may be performed using chemical mechanical polishing, etch back, or the like.

Furthermore, the diffusion prevention layer 154 may be separated into a plurality of pieces by removing a portion of the diffusion prevention layer 154 present on the rear surface 108 of the semiconductor substrate 105 while planarizing the buried conductive layer 156.

Accordingly, the buried conductive layers 156 may be respectively connected to the buried power rails 120 through the diffusion prevention layers 154. The buried conductive layers 156 may be used as rear via electrodes for connecting the buried power rails 120 to an external terminal.

According to such a structure, the buried power rails 120 may be connected to external power using the buried conductive layers 156, i.e., rear via electrodes. Accordingly, connection resistance between the buried power rails 120 and external power may be significantly lowered to reduce voltage drop due to wiring, thereby improving power transfer efficiency.

A semiconductor device 100 fabricated as described above may include the semiconductor substrate 105, the buried power rail 120 formed on the semiconductor substrate 105, and the buried conductive layer 156 connected to the buried power rail 120 through the rear surface 108 of the semiconductor substrate 105. The buried power rail 120, e.g., the plural buried power rails 120, may be formed in the device structure 110 and in the semiconductor substrate 105 to transfer power to the device structure 110. The buried conductive layers 156, i.e., rear via electrodes, may be formed by filling the rear surface via holes 145 connected to the buried power rails 120.

Hereinafter, an apparatus for manufacturing the described semiconductor device 100 is described.

Figure 15:
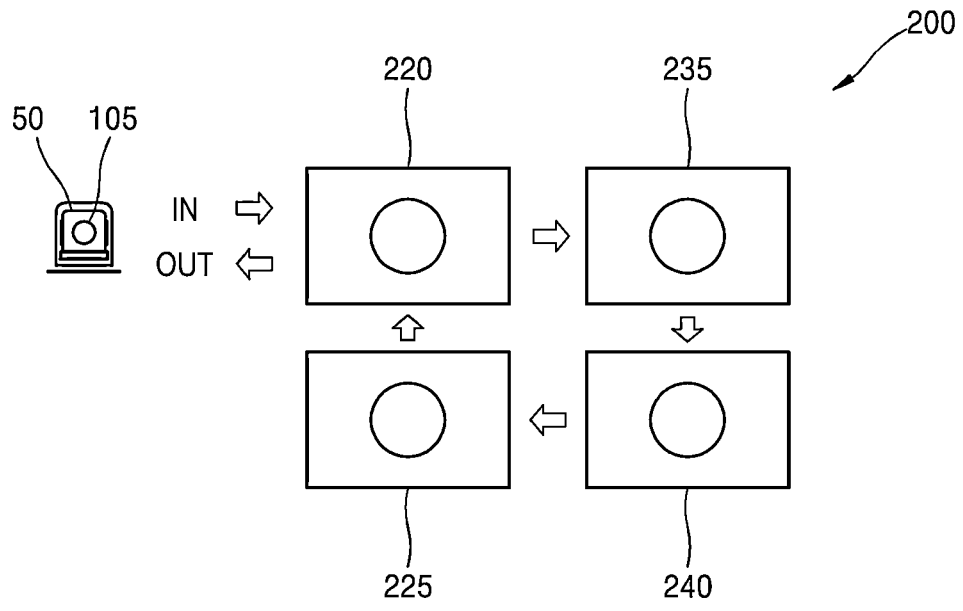
FIG. 15 is a schematic diagram illustrating a substrate processing system for forming a semiconductor device according to an embodiment of the present disclosure.

FIG. 15 is a schematic diagram illustrating a substrate processing system 200 for forming a semiconductor device according to an embodiment of the present disclosure.

Referring to FIG. 15, the substrate processing system 200 may include two or more of a metal deposition module 220, a metal-promoted chemical etch module 235, a wet etching module 240 and a dielectric layer deposition module 225.

More particularly, the metal deposition module 220 may be used to form the metal catalyst layer 140 on the rear surface 108 of the semiconductor substrate 105 to be at least partially aligned with the buried power rail 120. For example, the metal deposition module 220 may be any one of a sputtering device, chemical vapor deposition (CVD) device and atomic layer deposition (ALD) device for metal deposition Furthermore, the metal deposition module 220 may be used to form the buried conductive layer 156 for filling the rear surface via hole 145. In this case, since both the metal catalyst layer 140 and the buried conductive layer 156 may be formed in the metal deposition module 220, the substrate processing system 200 may be simplified. Furthermore, when the metal catalyst layer 140 are the buried conductive layer 156 are made of the same metal, the metal catalyst layer 140 and the buried conductive layer 156 may be formed in the same process as in the metal deposition module 220.

In some embodiments, when two or all of the buried power rail 120, the metal catalyst layer 140 and the buried conductive layer 156 are made of the same metal, the metal deposition module 220 may be formed in the same or similar process with the same metal. For example, two or all of the buried power rail 120, the metal catalyst layer 140 and the buried conductive layer 156 may include ruthenium (Ru), tungsten (W), platinum (Pt), gold (Au), or copper (Cu) in the same manner. Further, when it is necessary to lower deep levels of impurities, ruthenium (Ru) or tungsten (W) may be included in the same manner. Furthermore, when considering low resistivity, ruthenium (Ru) may be included.

However, in a modified form of this embodiment, the metal materials may not be identical to each other when the deposits of the buried power rail 120, the metal catalyst layer 140 and the buried conductive layer 156 are separated The metal-promoted chemical etch module 235 may be used to form the rear surface via hole 145 by supplying an etchant to the semiconductor substrate 105 and by anisotropically etching the semiconductor substrate 105 between the metal catalyst layer 140 and the buried power rail 120 while the metal catalyst layer 140 descends into the semiconductor substrate 105 using MACE. For example, the metal-promoted chemical 20 etch module 235 may consist of a wet etching device having an etch bath that can be filled by an etchant, or an etchant spray device that can spray an etchant onto the semiconductor substrate 105.

The wet etching module 240 may be used to remove the metal catalyst layer 140 lowered to the bottom surface of the rear surface via hole 145. Furthermore, the wet etching module 240 may be used to clean the semiconductor substrate 105.

In some embodiments, the metal-promoted chemical etch module 235 and the wet etching module 240 may be unified, and when MACE and etching of the metal catalyst layer 140, different etchants may be used.

The dielectric layer deposition module 225 may be used to form the liner dielectric layer 152 on at least one sidewall of the rear surface via hole 145. For example, the dielectric layer deposition module 225 may be configured as a chemical vapor deposition (CVD) or atomic layer deposition (ALD) device.

For fabricating the semiconductor device 100, the semiconductor substrate 105 in the substrate processing system 200 may be loaded into the metal deposition module 220. For example, the semiconductor substrate 105 may be accommodated in a vessel 50 and disposed in a loading port of the metal deposition module 220.

In some embodiments, an airtight type such as a Front Open Unified Pod (FOUP) may be used as the vessel 50. A plurality of semiconductor substrates 105, e.g., wafers, may be accommodated in the vessel 50. The vessel 50 may be placed in a loading port by a transfer device (not shown), such as an overhead transfer, an overhead conveyor, or an automatic guided vehicle, in a factory, a robot, or an operator.

The semiconductor substrate 105 is loaded into the metal deposition module 220 so that the metal catalyst layer 140 is formed on the rear surface 108 of the semiconductor substrate 105, transferred to the metal-promoted chemical etch module 235 so that a portion of the semiconductor substrate 105 is etched to form the rear surface via holes 145, transferred to the wet etching module 240 so that the metal catalyst layer 140 is etched, transferred to the dielectric layer deposition module 225 so that the liner dielectric layer 152 is formed, and transferred to the metal deposition module 220 so that the buried conductive layer 156 is formed.

By the substrate processing system 200, most of the formation processes of the rear surface via holes 145 and the buried conductive layer 156 may be performed within a single system.

Figure 16:
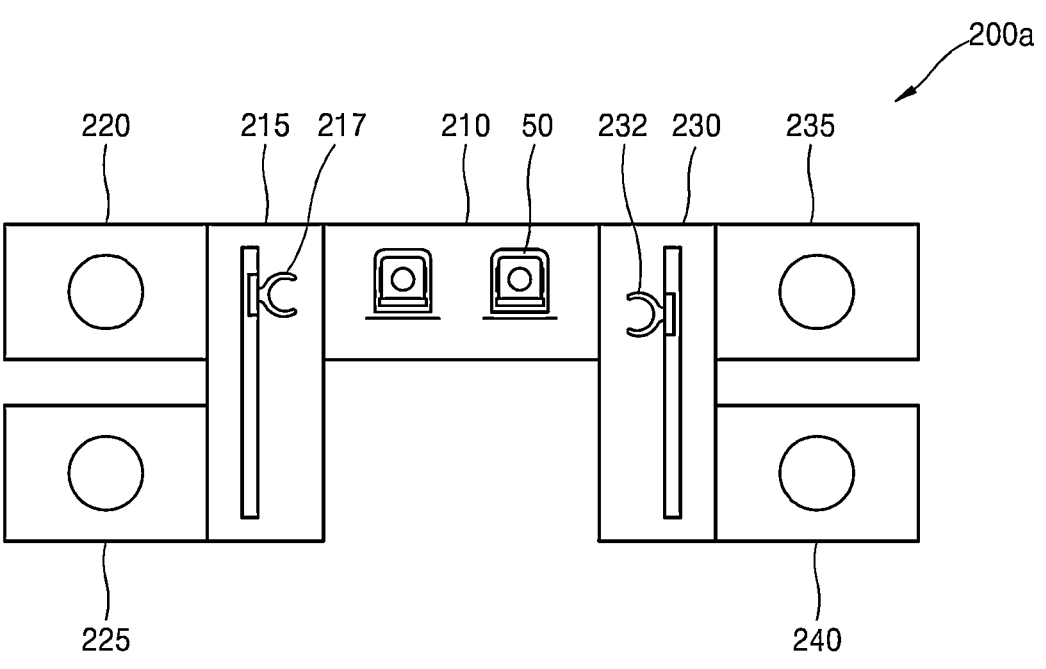
FIG. 16 is a schematic diagram illustrating a substrate processing system for forming a semiconductor device according to another embodiment of the present disclosure.

FIG. 16 is a schematic diagram illustrating a substrate processing system 200a for forming a semiconductor device according to another embodiment of the present disclosure. Since the substrate processing system 200a has been made by adding or modifying some constructions to or from the substrate processing system 200 of FIG. 15, the substrate processing system 200a may refer to the substrate processing system 200. Accordingly, duplicate descriptions are omitted in describing embodiments.

Referring to FIG. 16, the substrate processing system 200a may include a substrate in-out module 210, a metal deposition module 220, a metal-promoted chemical etch module 235, a wet etching module 240 and a dielectric layer deposition module 225.

The metal deposition module 220 and the dielectric layer deposition module 225 may be processed in a vacuum state, and the metal-promoted chemical etch module 235 and the wet etching module 240 may be processed in an atmospheric state. The vessel 50 may be loaded or unloaded in or from the substrate in-out module 210 in an atmospheric state, and when the semiconductor substrate 105 is transferred from the substrate in-out module 210 to the metal deposition module 220 or the dielectric layer deposition module 225, it may be switched to a vacuum state. The vessel 50 may be loaded in the substrate in-out module 210 in an atmospheric state, and when the semiconductor substrate 105 is transferred from the substrate in-out module 210 to the metal-promoted chemical etch module 235 or the wet etching module 240, an atmospheric state may be maintained.

Additionally, a first transfer module 215 may be further interposed between the substrate in-out module 210 and the metal deposition module 220 and between the substrate in-out module 210 and the dielectric layer deposition module 225. A transfer robot 217 may be installed in the first transfer module 215. In a vacuum state, the first transfer module 215 may transfer the semiconductor substrate 105 between the substrate in-out module 210 and the metal deposition module 220, between the substrate in-out module 210 and the dielectric layer deposition module 225, or between the metal deposition module 220 and the dielectric layer deposition module 225.

Additionally, a second transfer module 230 may be further interposed between the substrate in-out module 210 and the metal-promoted chemical etch module 235 and between the substrate in-out module 210 and the wet etching module 240. In the second transfer module 230, a transfer robot 232 may be installed. In an atmospheric state, the second transfer module 230 may transfer the semiconductor substrate 105 between the substrate in-out module 210 and the metal-promoted chemical etch module 235, between the substrate in-out module 210 and the wet etching module 240, or between the metal-promoted chemical etch module 235 and the wet etching module 240.

Optionally, the vessel 50 in the substrate in-out module 210 may be rotated in a direction of the first transfer module 215 or the second transfer module 230 to be accessible by the transfer robot 217 in the first transfer module 215 or the transfer robot 232 in the second transfer module 230.

Optionally, buffer modules for smooth transfer or rotation of the semiconductor substrate 105 may be further added between the substrate in-out module 210 and the first transfer module 215 and/or between the substrate in-out module 210 and the second transfer module 230.

According to the above-described substrate processing systems 200 and 200a, loading of the semiconductor substrate 105, formation of the metal catalyst layer 140, the liner dielectric layer 152 and the buried conductive layer 156, etching of the semiconductor substrate 105 for forming the rear surface via holes 145, etching of the metal catalyst layer 140, and the like may be performed within the same system. Accordingly, since the deposition and etching processes and the like may be performed within the one substrate processing system 200a, the transfer of the vessel 50 may be minimized and the processing time may be shortened, thereby securing economic feasibility.

In the above-described method of forming a semiconductor device and the above-described substrate processing systems 200 and 200a, the buried power rails 120 have been described as being used for power transfer to the device structure 110. However, in modified examples of the afore-mentioned embodiments, the buried power rails 120 may be used for signal transfer together with power transfer or for signal transfer, not power transfer. Accordingly, when the buried power rails 120 are used for signal transfer, the buried power rails 120 may be referred to as buried conductive lines. Accordingly, in the above descriptions, the buried power rails 120 may be changed to buried conductive lines. Referring to the descriptions, the rear surface via holes 145 may be formed to be connected to the buried conductive lines by etching the semiconductor substrate 105 using MACE, and then the step of forming the buried conductive layer 156 may be performed. Accordingly, according to the above-described method of forming a semiconductor device and the above-described substrate processing systems 200 and 200a, manufacturing cost can be reduced while sup-pressing plasma damage in the via holes 145 by the via holes 145 using MACE when forming the rear via electrode structures connected to the buried conductive lines formed in the semiconductor substrate 105.

As apparent from the above description, a method of forming a semiconductor device according to some embodi-ments of the present disclosure and a substrate processing system therefore can reduce damage to a substrate while lowering process costs. It is natural that the scope of the present disclosure is not limited to these effects.

Although the present disclosure has been described with reference to embodiments shown in the drawings, the embodiments are provided as only exemplary examples, and those skilled in the art will understand that various modifi-cations and equivalent other embodiments are possible therefrom. Therefore, the true technical protection scope of the present disclosure should be determined by the technical spirit of the appended claims.

What is claimed is:

1. A method of forming a semiconductor device, the method comprising:
   forming at least one metal catalyst layer on a rear surface of a semiconductor substrate to be at least partially aligned with at least one buried power rail, the at least one buried power rail being on the semiconductor substrate for power transfer; and
   forming at least one rear surface via hole by supplying an etchant to the semiconductor substrate such that a subportion of the semiconductor substrate between the at least one metal catalyst layer and the at least one buried power rail is anisotropically etched while the at least one metal catalyst layer descends to an inside of the semiconductor substrate using metal-assisted chemical etching (MACE), the forming of the at least one rear surface via hole being stopped while the at least one metal catalyst layer at least partially contacts an insulating liner layer.

2. The method according to claim 1, wherein the forming of the at least one rear surface via hole, at least partially stopping etching of the semiconductor substrate on the at least one buried power rail.

3. The method according to claim 2, wherein at least a top and side walls of the at least one buried power rail are surrounded by the insulating liner layer when viewed on the rear surface of the semiconductor substrate.

4. The method according to claim 1, wherein
   a diameter or width of the at least one metal catalyst layer is smaller than or equal to a diameter or width of the at least one buried power rail;
   the at least one metal catalyst layer includes a plurality of metal catalyst layers, and the at least one buried power rail includes a plurality of buried power rails; and
   at least one of:
      the plurality of metal catalyst layers are vertically aligned with the plurality of buried power rails when viewed from a cross-section of the semiconductor substrate to be spaced apart from each other, or
      the plurality of metal catalyst layers are vertically spaced from each other within the width of the plurality of buried power rails.

5. The method according to claim 1, wherein the at least one buried power rail includes a plurality of buried power rails;
   the at least one metal catalyst layer includes a plurality of metal catalyst layers; and
   the plurality of metal catalyst layers are at least partially aligned with the plurality of buried power rails, respec-tively.

6. The method according to claim 5, further comprising:
   forming a passivation insulating layer having openings aligned at least partially with the plurality of buried power rails on the rear surface of the semiconductor substrate, wherein
      the forming of the at least one metal catalyst layer includes respectively forming the plurality of metal catalyst layers in the openings of the passivation insulating layer.

7. The method according to claim 6, wherein the forming of the passivation insulating layer comprises:
   forming a photoresist layer on the passivation insulating layer to expose the openings of the passivation insu-lating layer; and
   etching the passivation insulating layer using the photo-resist layer as an etch protection layer to form the openings, wherein the forming of the at least one metal catalyst layer includes,
      forming the plurality of metal catalyst layers on the passivation insulating layer on which the photoresist layer remains, and
      removing a portion of the photoresist layer using a lift-off method to form the plurality of metal catalyst layers.

8. The method according to claim 1, further comprising:
   removing the at least one metal catalyst layer lowered to a bottom surface of the at least one rear surface via hole;
   forming a liner dielectric layer on at least a sidewall of the at least one rear surface via hole; and
   forming a buried conductive layer such that the at least one rear surface via hole is filled.

9. The method according to claim 8, further comprising:
   removing at least a portion of the insulating liner layer on the at least one buried power rail exposed by the at least one rear surface via hole based on the removing of the at least one metal catalyst layer such that the at least one buried power rail is exposed.

10. The method according to claim 8, wherein the forming of the liner dielectric layer comprises:
   forming the liner dielectric layer on an inner surface of the at least one rear surface via hole; and
   partially removing the liner dielectric layer on the bottom surface of the at least one rear surface via hole such that the liner dielectric layer remains on side walls of the at least one rear surface via hole.

11. The method according to claim 10, wherein the partially removing of the liner dielectric layer, is performed using anisotropic plasma etching.

12. The method according to claim 10, further comprising:

forming a diffusion prevention layer to be connected to the at least one buried power rail on the inner surface of the at least one rear surface via hole from which the liner dielectric layer is partially removed, wherein the buried conductive layer is formed in the at least one rear surface via hole to be connected to the diffusion prevention layer.

13. The method according to claim 8, wherein the at least one buried power rail, the at least one metal catalyst layer and the buried conductive layer comprise an identical metal.

14. The method according to claim 13, wherein the at least one buried power rail, the at least one metal catalyst layer and the buried conductive layer comprise ruthenium (Ru).

15. The method according to claim 1, wherein the etchant comprises a mixture of $H_2O_2$ and HF.

16. A method of forming a semiconductor device, the method comprising:

forming at least one metal catalyst layer on a rear surface of a semiconductor substrate to be at least partially aligned with at least one buried power rail, the at least one buried power rail being on the semiconductor substrate for power transfer;

forming at least one rear surface via hole by supplying an etchant to the semiconductor substrate such that a subportion of the semiconductor substrate under the at least one metal catalyst layer is anisotropically etched while the at least one metal catalyst layer descends to an inside of the semiconductor substrate using metal-assisted chemical etching (MACE), the forming of the at least one rear surface via hole being stopped as an insulating liner layer on the at least one buried power rail is at least partially exposed;

removing the at least one metal catalyst layer lowered to a bottom surface of the at least one rear surface via hole;

removing at least a portion of the insulating liner layer on the at least one buried power rail exposed by the at least one rear surface via hole;

forming a liner dielectric layer on at least a side wall of the at least one rear surface via hole;

forming a diffusion prevention layer to be connected to the at least one buried power rail on an inner surface of the at least one rear surface via hole, from which the liner dielectric layer is partially removed; and forming a buried conductive layer to fill the at least one rear surface via hole.

\* \* \* \* \*